United States Patent [19]
Shimoyama et al.

[11] Patent Number: 5,804,834
[45] Date of Patent: Sep. 8, 1998

[54] SEMICONDUCTOR DEVICE HAVING CONTACT RESISTANCE REDUCING LAYER

[75] Inventors: Kenji Shimoyama; Hideki Gotoh, both of Ushiku, Japan

[73] Assignee: Mitsubishi Chemical Corporation, Tokyo, Japan

[21] Appl. No.: 888,641

[22] Filed: Jul. 7, 1997

Related U.S. Application Data

[63] Continuation of Ser. No. 550,500, Oct. 30, 1995, abandoned.

[30] Foreign Application Priority Data

Oct. 28, 1994 [JP] Japan .................... 6-265498
Oct. 28, 1994 [JP] Japan .................... 6-265499
Oct. 28, 1994 [JP] Japan .................... 6-265503

[51] Int. Cl.$^6$ .................. H01L 29/06; H01L 31/0328; H01L 31/0336
[52] U.S. Cl. .................. 257/22; 257/96; 257/97; 257/98; 257/99; 372/45; 372/46; 372/49; 372/99
[58] Field of Search .................. 257/22, 17, 103, 257/94, 95, 96, 97, 98, 99; 372/45, 46, 49, 99

[56] References Cited

U.S. PATENT DOCUMENTS

| | | | |
|---|---|---|---|
| 5,005,057 | 4/1991 | Izumiya et al. | 257/22 X |
| 5,173,751 | 12/1992 | Ota et al. | 257/94 X |
| 5,258,990 | 11/1993 | Olbright et al. | 372/46 |
| 5,363,390 | 11/1994 | Yang et al. | 372/45 |
| 5,428,634 | 6/1995 | Bryan et al. | 372/45 |
| 5,434,426 | 7/1995 | Furuyama et al. | 250/551 |
| 5,523,589 | 6/1996 | Edmund et al. | 257/96 X |

FOREIGN PATENT DOCUMENTS

| 6021511 | 1/1994 | Japan | 257/96 |
|---|---|---|---|

*Primary Examiner*—William Mintel
*Attorney, Agent, or Firm*—Armstrong, Westerman Hattori, McLeland & Naughton

[57] ABSTRACT

In a wide band cap semiconductor, a $GaP_xN_{1-x}$ $(0.1 \leq x \leq 0.9)$ layer is inserted between a layer comprising AlGaInN and an electrode, The potential barrier between the electrode and the surface layer can be reduced. Contact resistance can be decreased, and ohmic contact can be easily taken up.

12 Claims, 4 Drawing Sheets

SEMICONDUCTOR DEVICE HAVING CONTACT RESISTANCE REDUCING LAYER

This application is a continuation of application Ser. No. 08/550.500 filed Oct. 30, 1995, now abandoned.

BACKGROUND OF THE INVENTION

The present invention relates to a semiconductor device, and in particular to a semiconductor device related to a light emitting element such as a blue or green light emitting diode using gallium nitride material, a blue or green laser diode, etc. with contact resistance extensively reduced.

In recent years, there has been remarkable technical progress toward higher luminance in blue or green light emitting diode (LED), and ZnSSe type materials or AlGaInN type materials are used. Because it is now possible to grow a high quality gallium nitride (GaN) compound semiconductor film on a substrate such as sapphire, SiC, etc. and to perform high concentration p-type doping to GaN system, blue light emitting diodes with high luminance are now practically produced, and a double heterostructure as shown in FIG. 2 is adopted. In FIG. 2, reference numeral 1 represents a sapphire substrate, 2 represents a GaN buffer layer, 3 represents an n-GaN buffer layer, 4 represents an n-AlGaN buffer layer, 5 represents a Zn doped InGaN active layer, 6 represents a p-AlGaN cladding layer, 7 represents a p-GaN contact layer, and 9 represents an electrode.

However, because GaN (Eg=3.39 eV) with a wide band gap is used in a surface contact layer as shown in FIG. 2, the potential barrier with the electrode tends to increase, and this causes the increase of operating voltage (Fig. 3; n-type; EC represents the energy at the bottom of the conduction band, EF represents Fermi level, EV is the energy at the bottom of the valence band, and q$\phi$B represents the potential barrier). To reduce contact resistance in such a wide band gap semiconductor, a heavily doped layer is inserted immediately under the electrode, i.e. a method to form a structure of metal-n+-n and "metal-p+-p". (FIG. 4; n-type). As a result, potential barrier remains, but the depletion layer becomes very thin, and carriers can pass freely by the tunnel effect. Thus, there will be no resistance any more. In the case of n-type GaN, it is possible to perform doping up to high concentration with hole concentration as high as $10^{19}$. On the other hand, in p-type GaN doping, it is only up to the level of $10^{17}$ at present. For this reason, it is very difficult to attain very low contact resistance in a layer, which comprises p-type AlGaInN. The increase of operating voltage induces heating of the element, and this causes serious problems leading to shorter service life.

At present, sapphire, SiC and other substrates are used as a GaN compound semiconductor substrate for a blue light emitting device. However, sapphire has some disadvantages in that it cannot be used for making a conductive substrate or that it cannot be cloven. Meanwhile, Sic can make a conductive substrate but it is costly. Moreover, both sapphire substrates and SiC substrates are extremely hard and it is very hard to cut them into chips for electronic device.

In semiconductor light emitting devices such as LEDs, light emitting laser, etc., a distributed Bragg reflector (DBR) having layers with different refractive indices alternately grown to meet Bragg's diffraction condition to the light emitting wavelength is often used to improve light squeezing efficiency. When this DBR is used, it is advantageous in that light absorption on the substrate can be reduced to extensively increase luminance or lateral light is reduced and directionality is improved to reflect the light toward the surface.

In AlGaAs and AlGaInP light emitting devices, as the lattice constants of AlN and GaN are quite different (inconsistency of lattice constants is 2.2%), it is substantially impossible to grow layers within the critical thickness when the mixed crystal ratio of Al and Ga is greatly changed. Then, in order to make coordination of lattice constants, the mixed crystal ratio of In has to be changed, and, as a result, it is very hard to grow DBR with high quality.

SUMMARY OF THE INVENTION

The above problems can be solved by inserting a thin film $GaP_xN_{1-x}$ (0.1≦x≦0.9) between the AlGaInN layer and the electrode.

This is because, even when the composition of p relative to GaN is increased in GaPN or even when the composition of N relative to GaP is increased, the band gap is decreased, a specific structure is present at the site where the band gap is decreased and is turned to zero in the intermediate composition. In this connection, to reduce contact resistance in a wide band gap semiconductor, a thin film $GaP_xN_{1-x}$ (0.1≦x≦0.9) having very small band gap or no band gap is inserted and, even when it is not possible to have very high carrier concentration, potential barrier between the electrode and the surface layer is extensively reduced and ohmic contact is very easy to achieve (FIG. 5; n-type).

The above problems can also be solved by inserting DBR comprising an $Al_xGa_{1-x}P$ (0≦x<1) and an $Al_yGa_{1-y}P$ (0<y≦1, x<y) layer alternately grown either above or under the light emitting layer.

AlGaP has band gap corresponding to green wavelength but it cannot be used for high power LEDs because AlGaP is an indirect gap semiconductor. However, according to the present invention, a film of DBR within critical thickness and with great reflectivity can easily be grown for green or blue LED because AlGaP is transparent to green and lattice constants of AlP and GaP are almost the same (inconsistency of lattice constants is 0.24%). Considering the production cost of LEDs, it is also advantageous in the present invention that GaP substrates with high quality are economically available.

In the present invention, the GaPN layer may be provided between an AlGaInN layer and an electrode. This is because it will suffice if the GaPN layer is in contact with each of the electrode and the AlGaInN layer, and a layer other than AlGaInN may be present as the other layer, which is not in contact with the GaPN layer. However, the present invention has remarkable effect particularly when the active layer is a layer comprising AlGaInN, or above all, AlGaN or InGaN.

As the thin film $GaP_xN_{1-x}$ (0.1≦x≦0.9) layer inserted between a layer comprising AlGaInN and an electrode, which is the essential feature of the present invention, there is no special restriction on thickness, composition etc. because these values are different according to carrier concentration and composition (band gap) of the layer comprising AlGaInN. It has preferably such a thickness that the effect to reduce contact resistance can be provided, and it is normally not higher than 1 $\mu$m. In many cases, a thickness of the order of 5 to 100 nm is used.

The method to prepare the thin film $GaP_xN_{1-x}$ (0.1≦x≦0.9) layer may be the same as the method to prepare the other layer of the semiconductor device of the present invention, and it is preferable to use MOCVD method or MBE method, but it is not limited to these.

The preferable mixed crystal ratio "x" is 0.1 or more and 0.9 or less, or more preferably more than 0.2 and 0.8 or less.

However, it is known that an alloy semiconductor of intermediate composition is difficult to grow because of the presence of a miscibility gap. Thus, a superlattice comprising a GaP-rich thin film and a GaN-rich thin film may be laminated as in an embodiment of the present invention. In this case, a band structure similar to uniform GaPN bulk can be attained if the composition as the entire layer is $GaP_xN_{1-x}$ ($0.1 \leq x \leq 0.9$). More concretely, between a layer comprising AlGaInN and an electrode, a multi-layer film having a thin film $GaP_yN_{1-y}$ ($y \geq 0.9$) layer and a thin film $GaP_zN_{1-z}$ ($z \leq 0.1$) layer alternately grown is provided. There is no special restriction on the number of layers in the multi-layer except that it should be 2 (1 period) or more, or more preferably 5 periods or more. It may be set at any value so far as there is no problem such as resistance. Also, it is preferable that the layer thickness per period is 10 molecular layers or less.

In case the semiconductor device of the present invention is used as a semiconductor light emitting device such as a light emitting diode, a light emitting laser, etc., it is possible to have a light emitting device having higher luminance and monochromaticity and directionality if a DBR with an $Al_xGa_{1-x}P$ ($0 \leq x < 1$) layer and an $Al_yGa_{1-y}P$ ($0 < y \leq 1$, x<y) layer alternately grown is provided above or under the active layer.

A DBR film having an $Al_xGa_{1-x}P$ ($0 \leq x \leq 1$) layer and an $Al_yGa_{1-y}P$ ($0 \leq Y1$) layer alternately grown can be manufactured by a known method.

In case this DBR is provided in light extracting direction seen from the active layer, it is provided with the purpose of reflecting the light which is absorbed by the electrode. For this purpose, the size of DBR should be the same as or a little smaller than that of the electrode.

On the contrary, in case it is provided on the opposite side of the light extracting direction seen from the active layer, it is provided with the purpose of preventing the absorption of light by the substrate. In particular, in case a substrate having a band gap not greater than the active layer is used, it is effective to arrange the DBR between the substrate and the active layer.

In any case, it is preferable that any layer with great light absorption is not inserted between DBR and the active layer.

In the present specification, AlGaInN system means a III-V compound semiconductor, which contains Al, Ga and/or In as III elements and nitrogen as a V element.

DETAILED DESCRIPTION OF THE PREFERRED EMBODIMENTS

In the following, detailed description will be given on the present invention in connection with the drawings, while the present invention is not limited to these embodiments, and it is needless to say that changes and modification can be made without departing from the spirit and the scope of the invention.

Example 1

Figure 1:
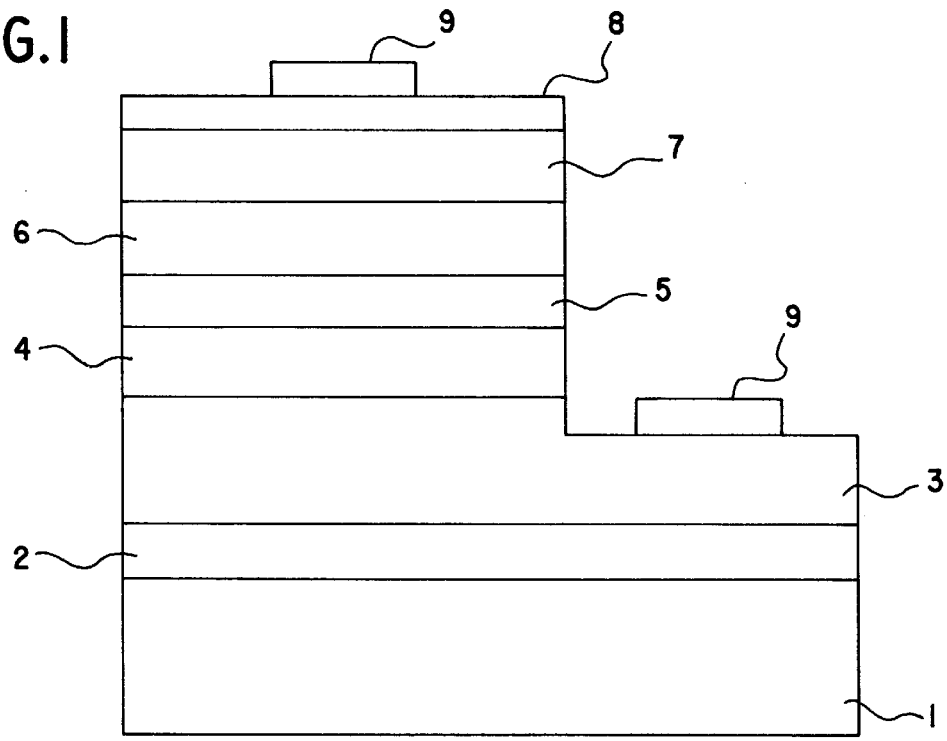
FIG. 1 represents an example of a semiconductor device according to the present invention, i.e. a semiconductor device manufactured in Example 1.
Figure 2:
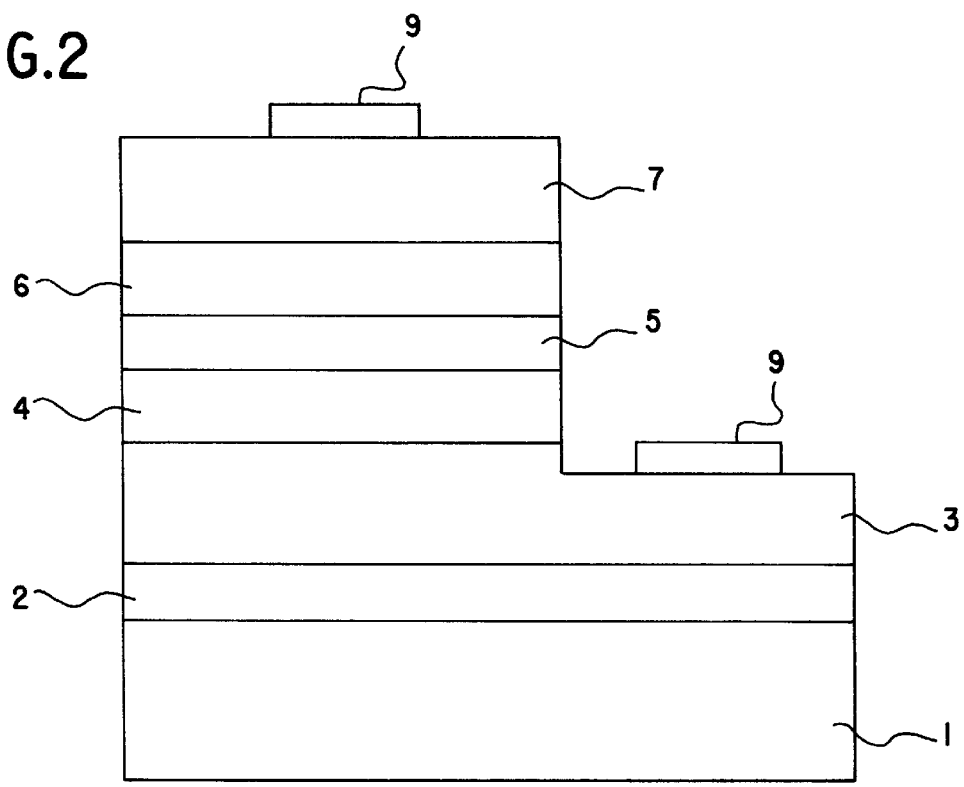
FIG. 2 represents a conventional type semiconductor device.
Figure 3:
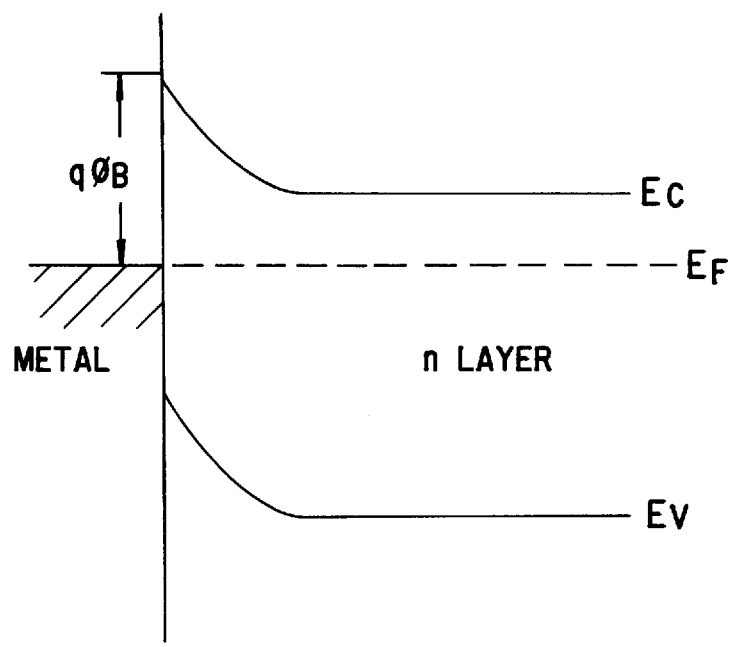
FIG. 3 is a drawing for explaining energy band in case an electrode is provided directly above a conventional type AlGaInN semiconductor layer.
Figure 4:
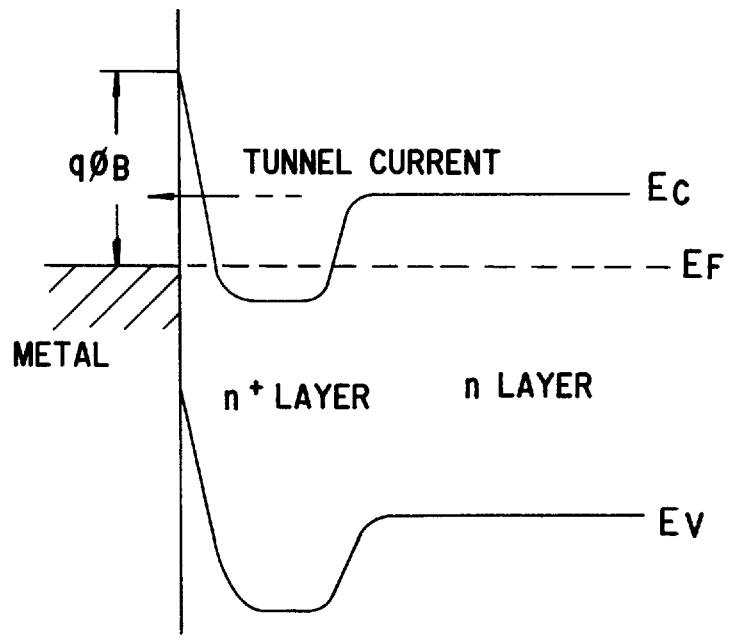
FIG. 4 is a drawing for explaining energy band in case a heavy dope layer is provided on a conventional type AlGaInN semiconductor layer and an electrode is arranged above it.
Figure 5:
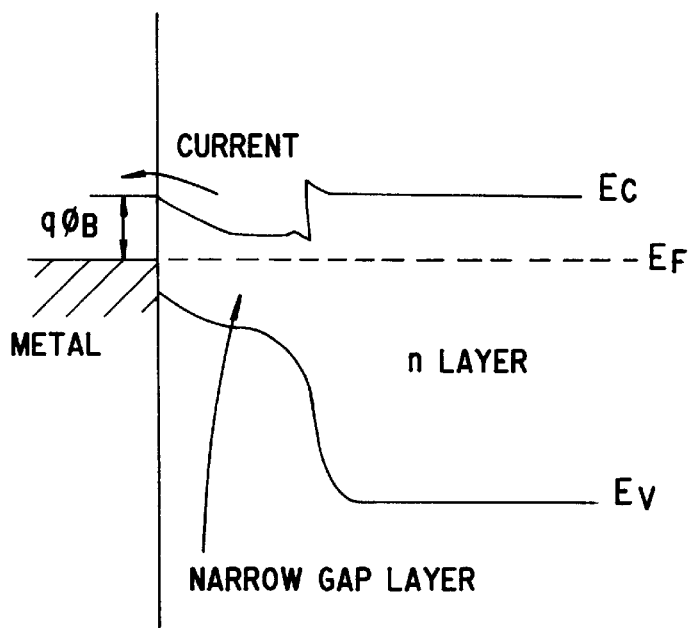
FIG. 5 is a drawing for explaining energy band in case a $GaP_xN_{1-x}$ ($0.1 \leq x < 0.9$) layer is inserted on the AlGaInN semiconductor layer of the present invention and an electrode is arranged.
Figure 6:
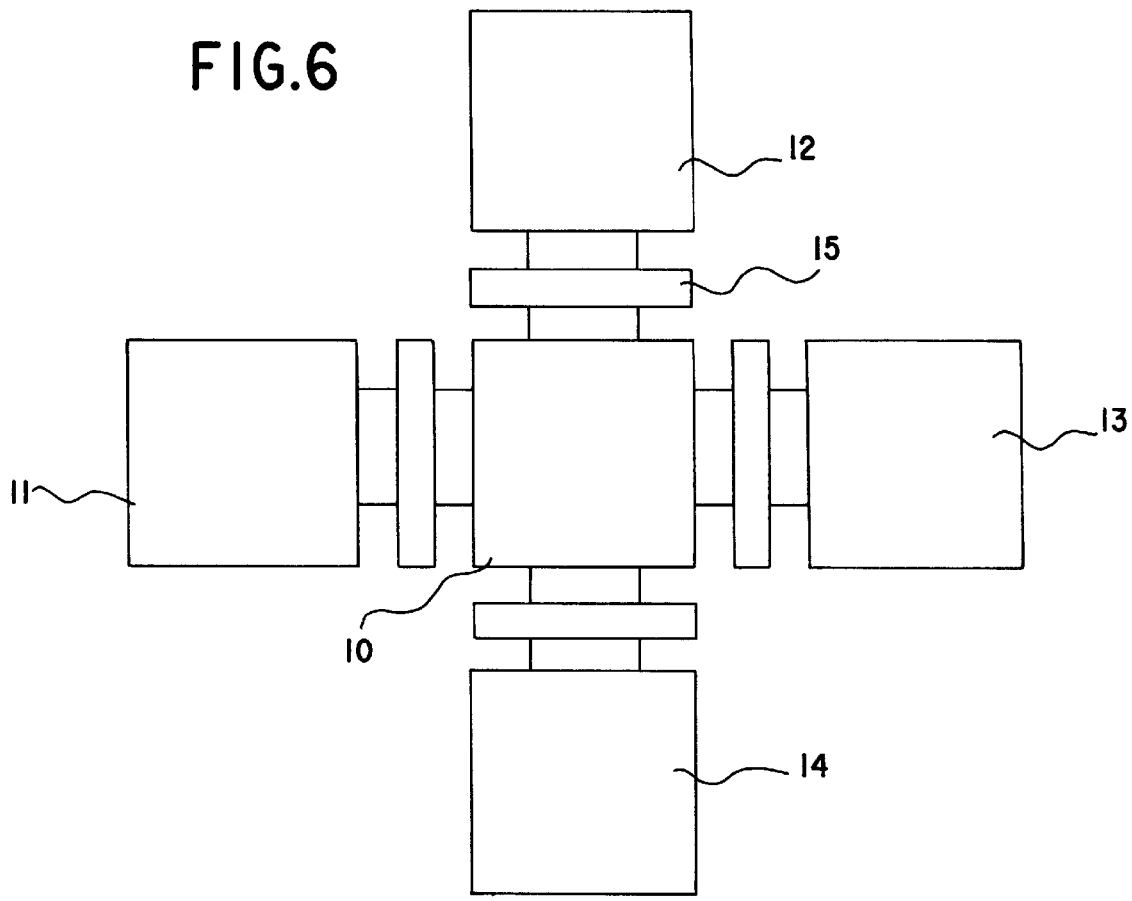
FIG. 6 is a drawing for explaining the manufacturing device used in Example 1.

In the arrangement of a device used for growth of the present invention, a substrate transport chamber 10 is arranged at the center as shown in FIG. 6, and a substrate exchange chamber 11 and three reduced pressure MOCVD devices are provided. A gate valve 15 is arranged between each chamber and the device. A deposition (growth) chamber 1 (12) is an ordinary MOCVD device and is used for growth of AlGaInN compound semiconductor. A deposition chamber 2 (13) is also an ordinary MOCVD device, and it is used for growth of III-V compound semiconductor other than AlGaInN. A deposition chamber 3 (14) can achieve radical decomposition of the raw materials by microwave excitation, and it is used for nitriding of substrate surface and for growth of AlGaInN compound. Description is now given on growth procedure or an expitaxial wafer having a structure as shown in FIG. 1.

First, a sapphire substrate is introduced into the deposition chamber 3 (14) and temperature is raised for heating, At 500° C., with nitrogen gas ($N_2$) as raw material before growth, radical nitrogen is supplied to the substrate surface by microwave excitation, and oxygen (O) atoms on the surface are substituted with N atoms, i.e. nitriding is carried out. On this surface, a GaN buffer layer of 20 nm is deposited. Thereafter, the substrate is cooled down, and the substrate is moved via the transport chamber toward the deposition chamber 1 (12). An n-type GaN buffer layer of 4 μm, an n-type $Al_{0.2}Ga_{0.8}N$ cladding layer of 1 μm, a Zn doped $In_{0.1}Ga_{0.9}N$ active layer of 0.1 μm, a p-type $Al_{0.2}Ga_{0.8}N$ cladding layer of 1 μm, and a p-type GaN contact layer of 1 μm are sequentially deposited on the epitaxial film growth substrate at the growth temperature of 1000° C. In this case, hydrogen is used as carrier gas, and trimethyl gallium (TMG), trimethyl aluminum (TMA), and trimethyl indium (TMI) are used for III raw materials. For V raw materials, ammonia ($NH_3$) is generally used, while dimethylhydrazine having high decomposing efficiency at low temperature or organic metal such as ethyl azide may be used to reduce growth temperature. Si or Ge was used as n-type dopant, and Mg or Zn is used as p-type dopant. When necessary, heat treatment is conducted in the deposition chamber subsequently after the growth to activate carriers. Then, the substrate is cooled down and is moved via the transport chamber toward the deposition chamber 2 (13). The substrate is heated to 700° C., and a $GaP_{0.2}N_{0.8}$ layer of 20 nm in thickness is deposited as a contact resistance reducing layer 8 on the epitaxial film growth substrate. In this case, hydrogen is used as carrier gas, and TMG is used for III raw materials, and $NH_3$ and phosphine ($PH_3$) are used for V raw materials. When the $GaP_{0.2}N_{0.8}$ contact resistance reducing layer 8 is too thick, absorption of the emitted light is increased. As in the above example, even a very thin film with no influence of light absorption is very effective for reducing contact resistance. Because the contact resistance reducing layer has very low resistivity, it plays a role to spread electric current on the surface.

On the surface of the epitaxial wafer thus grown, an electrode is formed, and a chip is fabricated. When this chip is assembled as a light emitting diode and light is emitted, very good values are obtained, i.e. light emitting wavelength is 420 nm and light emitting output is 800µW at forward current of 20 mA. In this case, operating voltage is 3.3 V. On a conventional type light emitting diode with the electrode formed on the surface of p-GaN prepared for comparison purpose, operating voltage is 4.0 V. This decrease of the operating voltage means the decrease of heat in the element itself, and service life of the element can be extensively improved.

Example 2

On an epitaxial film growth substrate, a GaP layer with thickness of one molecular layer and a GaN layer with thickness of 3 molecular layers are laminated for 10 periods alternately and a $GaP_{0.25}N_{0.75}$ contact resistance reducing layer is provided by the same procedure as in Example 1 except that light is emitted from the light emitting diode thus prepared. As a result, very good values could be obtained, i.e. light emitting wavelength is 420 nm and light emitting output is 800 µW at forward current of 20 mA. In this case, operating voltage is 3.4 V.

Example 3

First, an n-type GaP (111) B substrate 16 is introduced into a deposition chamber 2 (13), and temperature is raised to heat. At 750° C., an n-type GaP buffer layer 17 of 0.5 µm, a DBR film comprising an n-type $Al_{0.2}Ga_{0.8}P$ of 38.6 nm and AlP of 42.9 nm alternately laminated by 10 layers, and an n-type GaP protective layer 19 are sequentially grown on the GaP substrate 16. In this case, hydrogen is used as carrier gas, and trimethyl gallium (TMG) and trimethyl aluminum (TMA) are used for III raw materials, and phosphine ($PH_3$) is used for V raw materials. Then, the substrate is cooled down and is moved via the transport chamber toward the deposition chamber 3. The substrate is heated to 600° C. Before growth, nitrogen gas ($N_2$) is used as a raw material, and radical nitrogen is supplied to substrate surface by microwave excitation, and P atoms on the surface are substituted with N atoms, i.e. surface nitrodation is performed. On this surface, an n-type $In_{0.3}Ga_{0.7}N$ buffer layer 20 is grown by 10 nm. Then, the substrate is cooled down and is moved via the transport chamber toward the deposition chamber (12). The substrate is heated to 700° C., and an n-type $In_{0.3}Ga_{0.7}N$ buffer layer 20 of 1 µm, an n-type $In_{0.3}(Al_{0.2}Ga_{0.8})_{0.7}N$ cladding layer 23 of 1 µm, Zn doped $In_{0.3}Ga_{0.7}N$ active layer 22 of 0.1 µm, a p-type $In_{0.3}(Al_{0.2}Ga_{0.8})_{0.7}N$ cladding layer 23 of 1 µm, and a p-type $In_{0.3}GaN$ contact layer 24 of 1 µm were sequentially grown on the epitaxial film growth substrate. In this case, hydrogen is used as carrier gas, and TMG, TMA and trimethyl indium (TMI) are used for III raw materials. For V raw materials, ammonia ($NH_3$) is generally used, while dimethyl hydrazine having high decomposing efficiency at low temperature or organic metal such as ethyl azide may be used to reduce growth temperature. Si or Ge is used as n-type dopant, and Mg or Zn is used as p-type dopant. When necessary, heat treatment is carried out in the deposition chamber after the growth to activate carriers. A {111} B face is used as the substrate because it is easier to nitride GaP surface. Here, the {111} B face is a {111} B face having only V compounds on the surface in case of III-V compound semiconductor.

Figure 7:
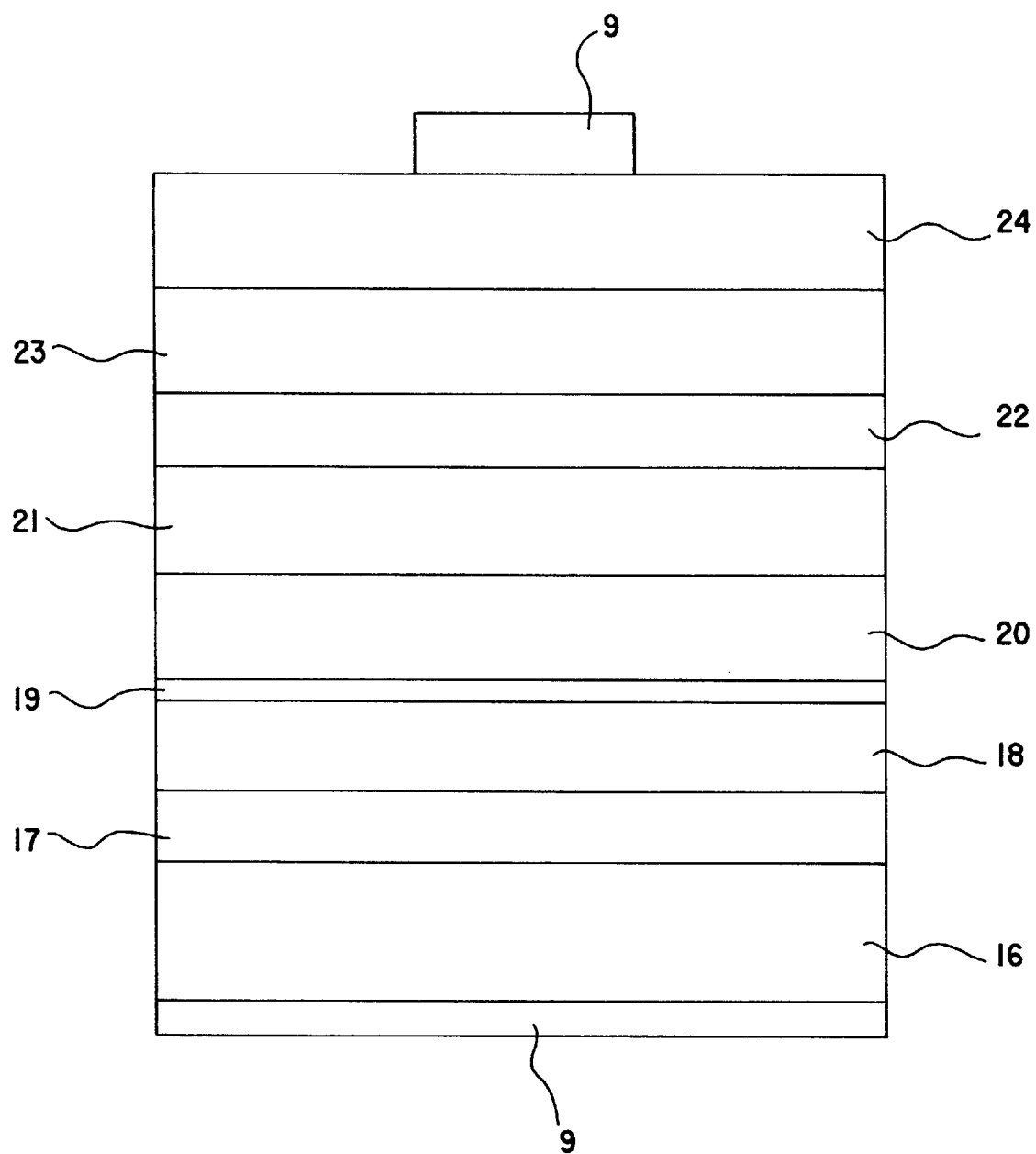
FIG. 7 is a drawing for explaining another example of the semiconductor device of the present invention, i.e. a semiconductor device manufactured in Example 3.

Then, a full face electrode 9 is formed on the substrate side, and a circular electrode 9 of 100 µm in diameter is formed on the surface side, and a chip is fabricated (FIG. 7). When this is assembled as a light emitting diode and light is emitted, very good values are obtained, i.e. light emitting wavelength is 520 nm and light emitting output is 500 µW at forward current of 20 mA.

Further, when a DBR film is formed immediately under the circular electrode on the surface side, absorption at the electrode is reduced, and luminance could be improved by about 50%.

The above examples are light emitting diodes, while it is needless to say that the same effect can be obtained with semiconductor laser. It is possible to reduce loss due to the decrease of resistance and to obtain effect in case of any semiconductor element, which has an electrode directly above the AlGaInN semiconductor layer.

By inserting a thin film $GaP_xN_{1-x}$ ($0.1 \leq x \leq 0.9$) layer between a layer comprising AlGaInN and an electrode, it is possible to reduce resistance. When this is used as a light emitting device, operating voltage can be extensively reduced, and properties of ultraviolet to red AlGaInN light emitting element as well as service life of the element can be extensively improved.

By inserting DBR comprising an $Al_xGa_{1-x}P$ ($0 \leq x < 1$) and an $Al_yGa_{1-y}P$ ($0 < y \leq 1$, x<y) layer alternately grown either above or under the light emitting layer, blue to green LED with high power, high uniformity of color and high directionality can be easily obtained.

According to the present invention, DBR with high quality and high reflectivity can be easily provided either above or under the light emitting layer, and blue to green vertical cavity surface emitting laser can be obtained with the present invention. Thus, the industrial value of this invention is high.

What we claim are:

1. A semiconductor device, comprising a thin film $GaP_xN_{1-x}$ ($0.1 \leq x \leq 0.9$) layer between a layer of AlGaInN and an electrode.

2. A semiconductor device according to claim 1, wherein said layer of AlGaInN is of p-type.

3. A semiconductor device according to claim 1 or 2, wherein said $GaP_xN_{1-x}$ ($0.1 \leq x \leq 0.9$) layer is formed by alternately laminating a $GaP_yN_{1-y}$ ($y \geq 0.9$) layer and a $GaP_zN_{1-z}$ ($z \leq 0.1$) layer.

4. A semiconductor device according to claim 3, wherein said $GaP_yN_{1-y}$ ($y \geq 0.9$) layer and said $GaP_zN_{1-z}$ ($Z \leq 0.1$) layer are not thicker than 10 molecular layers.

5. A semiconductor device, comprising a distributed Bragg reflector comprising an $Al_xGa_{1-x}P$ ($0 \leq x < 1$) layer and an $Al_yGa_{1-y}P$ ($0 < y \leq 1$, x<y) layer alternately grown and an AlGaInN light emitting layer, said distributed Bragg reflector being provided at least one of (1) above said light emitting layer and (2) under said light emitting layer.

6. A semiconductor device according to claim 5, further comprising a substrate having a band gap not greater than a band gap of the light emitting layer.

7. A semiconductor device according to claim 6, wherein said distributed Bragg reflector is provided between the substrate and the light emitting layer.

8. A semiconductor device according to claim 6, which has a GaP substrate.

9. A semiconductor device according to claim 8, wherein a surface of the GaP substrate is a {111} B face.

10. A semiconductor device according to claim 5, wherein said distributed Bragg reflector is provided between the light emitting layer and an electrode.

11. A semiconductor device according to claim 5, wherein said distributed Bragg reflector is provided as one of either (1) above said light emitting layer or (2) under said light emitting layer.

12. A semiconductor device according to claim 11, wherein said semiconductor device is a light emitting diode.

\* \* \* \* \*